United States Patent [19]
Liong et al.

[11] Patent Number: 5,677,890
[45] Date of Patent: Oct. 14, 1997

[54] MODULAR CACHE MEMORY BATTERY BACKUP SYSTEM

[75] Inventors: Thomas Singkiat Liong, San Jose; Krishnakumar Rao; Parveen Kumar Gupta, both of Fremont, all of Calif.

[73] Assignee: Mylex Corporation, Fremont, Calif.

[21] Appl. No.: 613,064

[22] Filed: Mar. 8, 1996

[51] Int. Cl.$^6$ .................................................. G11C 00/00
[52] U.S. Cl. .................. 365/229; 365/222; 365/227; 365/228
[58] Field of Search .................... 365/229, 228, 365/49, 227, 222

[56] References Cited

U.S. PATENT DOCUMENTS

| | | | |
|---|---|---|---|
| 4,977,537 | 12/1990 | Dias et al. | 364/900 |
| 5,204,963 | 4/1993 | Noya et al. | 395/750 |
| 5,438,549 | 8/1995 | Levy | 365/229 |

Primary Examiner—David C. Nelms
Assistant Examiner—Hien Nguyen
Attorney, Agent, or Firm—Fish & Richardson P.C.

[57] ABSTRACT

A method and apparatus providing a battery backup for a dynamic random access memory (DRAM) cache system that senses the $V_{cc}$ level supplied through the cache controller to the cache memory and, if $V_{cc}$ falls below a preset threshold level, the battery backup apparatus switches the cache memory array to a backup battery $V_{cc}$ source, and a backup refresh control generator unit that is also powered by the backup battery $V_{cc}$ source. The cache DRAM, backup battery, and backup refresh generator are physically contained in a single module that can be disconnected from the cache controller and host computer system while preserving the cache memory contents. The backup system is installed in an operating host system for recovery of the cache memory contents and/or resumption of execution of the program that was running when the $V_{cc}$ power failure occurred.

9 Claims, 6 Drawing Sheets

| INPUT CODE | | $V_{CC} > V_T$ | CACHE STATE | INPUT SET SELECTED | OUTPUT TO CACHE ARRAY 200 |
| --- | --- | --- | --- | --- | --- |
| MSB | LSB | | | | |
| 0 | 0 | NO | NOT DIRTY | 0 | LOW LOGIC |
| 0 | 1 | NO | DIRTY | 1 | REFRESH UNIT |
| 1 | 0 | YES | NOT DIRTY | 2,3 | CACHE CONTROLLER |
| 1 | 1 | YES | DIRTY | 2,3 | CACHE CONTROLLER |

MODULAR CACHE MEMORY BATTERY BACKUP SYSTEM

FIELD OF THE INVENTION

The present invention relates to a system for storing and retrieving data in a computer cache memory. More specifically, the invention is a system for providing the retention of data in a computer cache memory upon power loss or controller loss by using a battery backup system.

BACKGROUND OF THE INVENTION

A computer memory cache is a fast memory in which frequently used data is stored for efficient use by the associated central processing unit (CPU). Cache memories were introduced to achieve a significant increase in the performance of the CPU at a very modest increase in cost. The cache memory (or simply "cache") is a high speed storage unit that is designed to operate with the CPU and the generally slower main memory unit. Because the cache is transparent to the program at the instructional level, it can be added to a computer system design without changing the instruction set and without modifying existing programs.

A cache memory can be used in a free-standing computer system for speeding-up CPU access to main memory (dedicated or shared), or used in conjunction with a host processor in an embedded computer system for speeding-up memory access. Also, main memory can be a collection of one or more storage devices using one or more storage technologies. However, for purposes of explaining the present invention, the free-standing computer system application will be used because the application of the present invention to other computer systems will become apparent to those practicing the art.

The use of a cache in a computer system is based upon two observations with respect to a referenced stored item: soon after being referenced, the referenced stored item will tend to be referenced again; and items stored near the referenced item will also tend to be referenced soon after. The cache provides efficient access to frequently used data by storing segments (lines or pages) of main memory in a fast memory local to the CPU.

When the CPU makes a request of memory, the CPU generates an address and searches the cache for the desired item. If the item is found in cache, a "hit" results and the item is applied to the CPU. If the item is not in cache, a "miss" results and the address is passed on to main memory. When a segment of main memory containing the referenced item is returned, a copy of the segment is stored in cache. If no cache storage space is available, the cache controller typically provides the necessary space by replacing the least recently used (LRU) segment with the latest referenced segment.

A common form of cache memory is based on MOS (metal oxide semiconductor) technology in which binary data is efficiently stored as a charge on a MOS transistor gate. This form of memory cell has low power dissipation and conserves chip area relative to bistable flip-flop memory cells. For an N-channel (NMOS) device, a sufficiently small positive charge capacitively stored on the gate will turn the device on while removing the charge will turn the device off (non-conducting). The on state may be interpreted as either a logic 1 or 0. These cells, either NMOS or PMOS, are charge storage capacitors with driver transistors. The memory also requires means for sensing the presence or absence of a charge and for placing or removing the charge from the gate.

The disadvantage to the use of these MOS memory cells is that the capacitively stored charge eventually leaks off and causes the stored data to be lost. In addition, the read process is destructive because a stored charge is discharged when the state is read. Because of the leakage and because of the destructive read characteristic, means are provided for restoring the prior state of the cell after reading. Thus, by periodically reading the contents of memory and restoring the data, a "refresh" mode is established that can preserve stored data indefinitely unless a failure of the refresh mode or the power supply occurs. This refresh mode gives rise to the term "dynamic" memory cell. Despite this disadvantage, dynamic random access memories (DRAMs) formed from an array of dynamic memory cells have found widespread use because of the high bit packing densities that can be achieved on a chip.

Because solid state random access memories (RAMs) are volatile, i.e. they lose their memory when the power is turned off, it is common prior art practice to provide a battery backup power supply for the cache memory controller, which in turn provides power from the cache memory controller to the cache memory cell array. This precaution allows the memory to function and retain its memory during a power outage.

Figure 1:
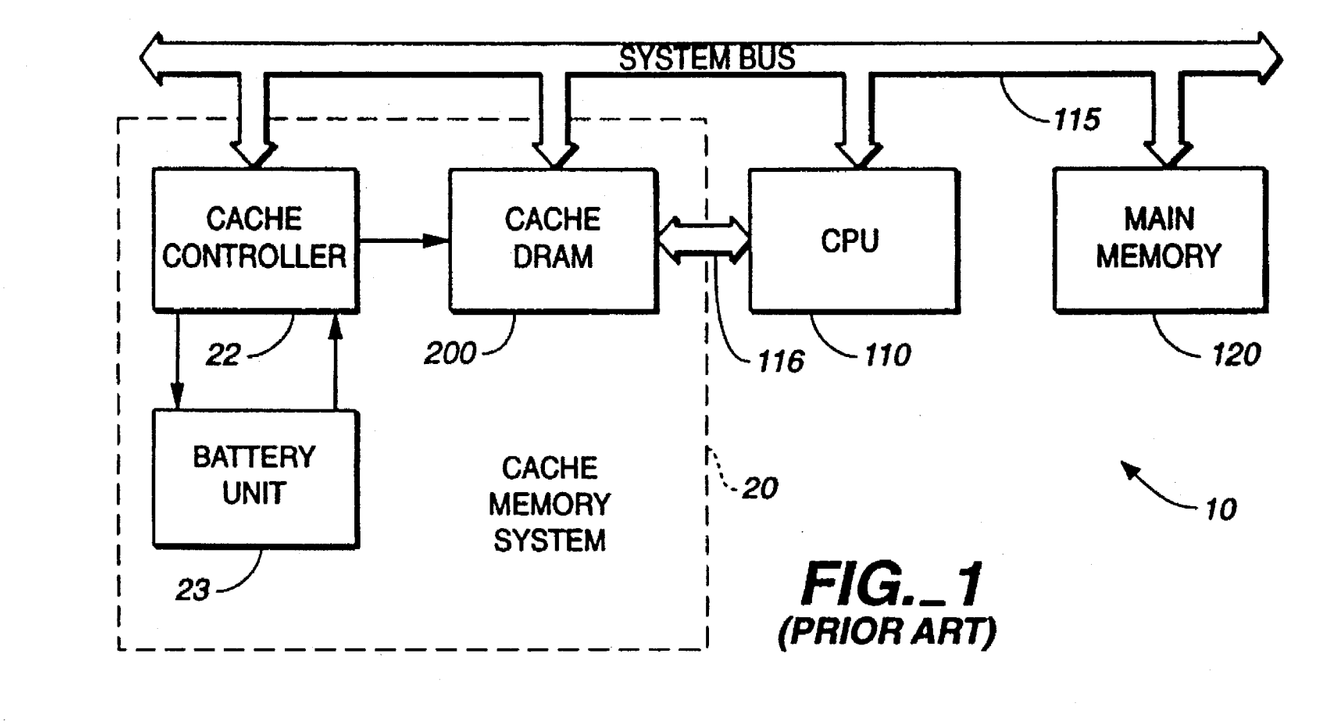
FIG. 1 is a block diagram of a typical prior art computer system with a cache memory system that includes a cache controller, a cache DRAM, and a battery backup unit.

FIG. 1 shows an example of a prior art computer system 10 that includes a cache memory system 20. Data and control signals are distributed through system 10 by system bus 115, which interconnects cache memory system 20, CPU 110, and main memory 120. Cache memory system 20 includes cache DRAM 200 for storing data, cache controller 22 for controlling the operating modes of cache DRAM array 200 (such as read/write to cache and to main memory, and refresh of cache DRAM array 200), and battery backup unit 23 to provide power to cache controller 200 and cache DRAM 200. An additional data and control path 116 may be provided for allowing CPU 110 a direct communication channel with cache memory system 20.

Figure 2:
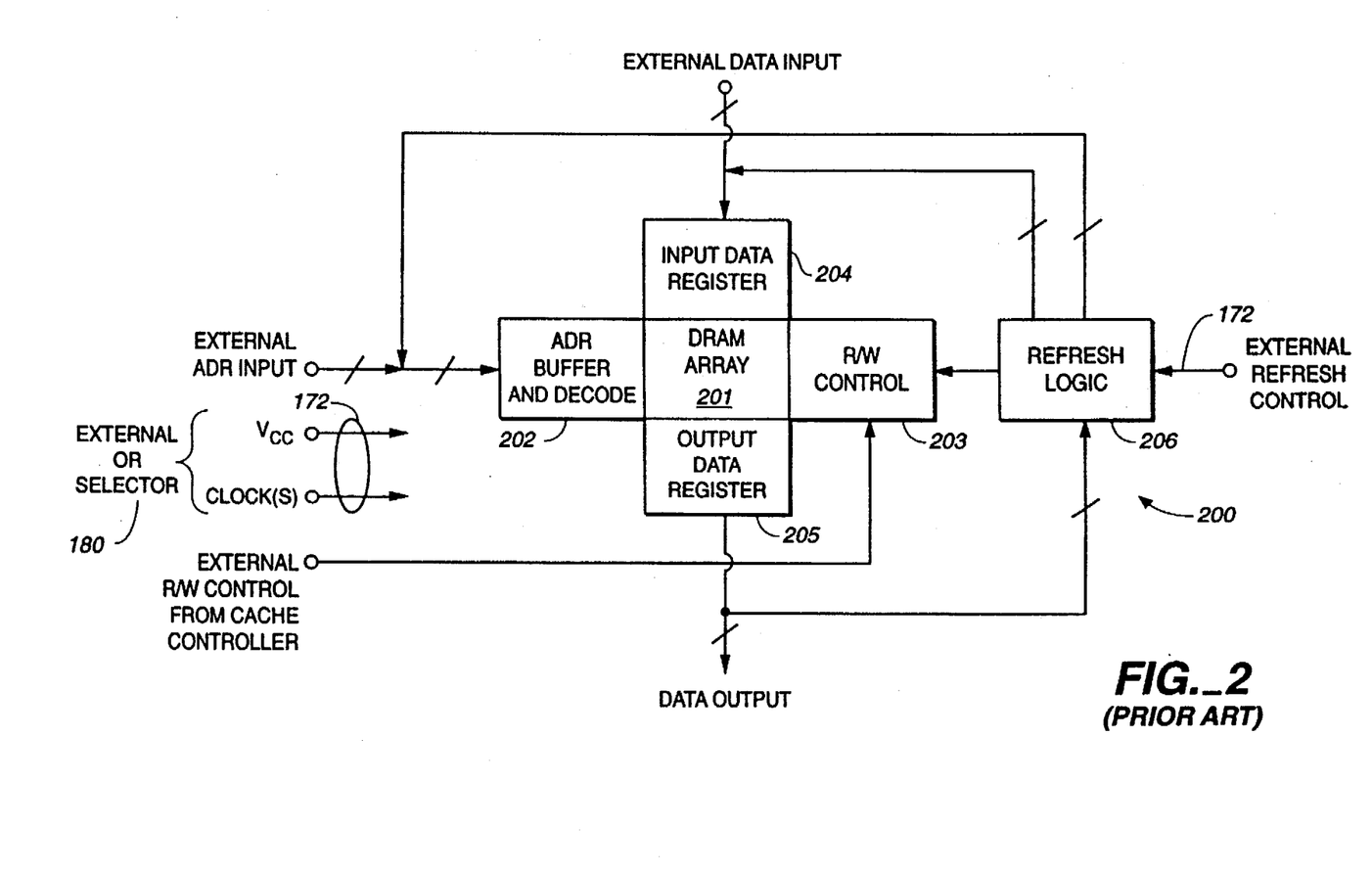
FIG. 2 is a block diagram of a prior art cache DRAM including refresh control.

FIG. 2 shows the basic architecture of a cache DRAM 200 suitable for use in the cache memory system 20 of FIG. 1. The cache DRAM is organized around the storage element, DRAM array 201. A set of interfaces are provided: address buffer register and address decode 202 for decoding input data addresses, read/write (r/w) control 203 for selecting a read or write operating mode, input data register 204 for receiving write data, and output data register 205 for outputting read data. In addition, a refresh logic and address counter 206 is used to periodically refresh the contents of DRAM array 201 by reading, and then writing back into the same address, the contents of DRAM array 201 by using an internal address counter to generate all of the addresses in DRAM array 201. The refresh logic control is provided by cache controller 22 (FIG. 1) on input lines 172. Input lines 172 also carry the power ($V_{cc}$) required by cache memory system 20 (FIG. 1). Power to cache DRAM 200 is provided through cache controller 22 (FIG. 1).

Referring again to FIG. 1, in the case of power ($V_{cc}$) failure to cache controller unit 22, battery unit 23 is switched in by cache controller 22 for keeping both the cache controller and cache DRAM functioning. However, prior art backup methods, such as described and shown in FIG. 1, do not provide cache memory protection in the case of a cache controller failure because the refresh function and the backup battery switching action is controlled by and through controller 22.

Therefore, there is a need for a cache memory system that is capable of saving cached data in the event of either a general power failure or a controller failure by providing battery backup power directly to the memory array and by providing for the DRAM refresh function on a separate assembly so that the DRAM continues to retain its memory until the faulty controller is replaced or the DRAM memory array with backup can be transferred to a system with a working cache controller.

SUMMARY OF THE INVENTION

Briefly, the invention consists of a modular assembly for use in a computer system for providing a cache DRAM battery backup system that is physically separable from the associated cache memory controller. The modular assembly is normally powered by a system power supply. A refresh control signal normally provided by an external source generates a set of refresh signals for refreshing the cache memory. The modular assembly of the invention includes:

(1) a cache DRAM for caching data for an associated CPU;

(2) a battery power source for operating the cache (3) a refresh generator which may be powered by the battery power source; and (4) a controller for selecting between the system power supply and the battery power source for providing power to the modular assembly when the system power fails, and for connecting the refresh generator to the cache memory array when the system power supply output level falls below a predetermined level.

The modular assembly can be physically disconnected from the host computer system for the life of the battery power source without losing the cache memory contents. [dr]

BRIEF DESCRIPTION OF THE INVENTION

The present invention will be more fully understood from the detailed description given below and from the accompanying drawings of the preferred embodiments of the invention, which, however should not be taken to limit the invention to the specific embodiment but are for explanation and better understanding only.

DESCRIPTION OF THE PREFERRED EMBODIMENTS

Figure 3:
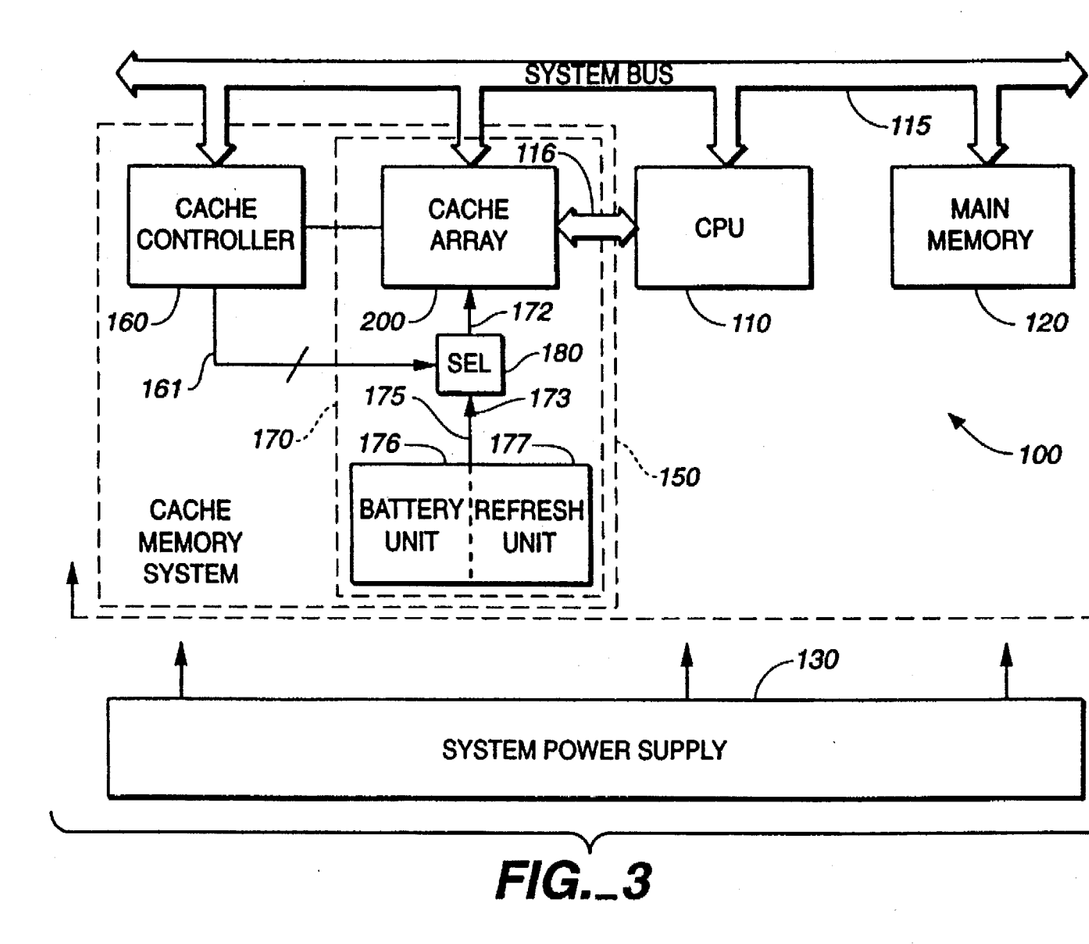
FIG. 3 is a block diagram of a computer system using the modular cache memory backup system.

FIG. 3 is a block diagram of a computer system 100 that includes a cache memory system 150 with a modular assembly backup system 170 that overcomes the limitations of prior art backup systems.

FIG. 3 shows a computer system which includes a CPU 110, main memory 120, and cache memory system 150 as elements that are interconnected by system bus 115. An alternate communication path 116 between cache memory system 150 and CPU 110 is shown that provides a direct path and reduces the traffic on system bus 115. System power supply 130 provides operating power to all active elements of the computer system.

Cache memory system 150 includes cache controller 160 and modular assembly backup system 170. Modular backup system 170 includes cache array 200 as previously described and shown in FIGS. 1 and 2, backup controller and selector (SEL) 180, battery backup unit 176, and refresh unit 177. Backup controller and selector 180 monitors the state of the power ($V_{cc}$) supplied by cache controller 160 on lines 161. Lines 161 also carry the necessary refresh control signals required by the refresh logic and address counter 206, shown in cache DRAM array 200 in FIG. 2. The output of battery and refresh unit 175 is connected to backup controller and selector 180 by lines 173 that carry the backup power ($V_{cc}$) from battery unit 176 needed to operate cache array 200 and refresh unit 177 of battery and refresh unit 175. Output lines 172 provide the power and refresh control signals selected by backup controller and selector 180 for operating the refresh logic of cache DRAM 200. Output lines 172 from controller and selector 180 provide the power needed to operate refresh unit 177.

Battery unit 176 is a standby $V_{cc}$ source for supplying power to all active components of modular backup system 170 through controller and selector 180.

Referring to FIG. 3, refresh unit 177 generates a set of control signals matched to the requirements of the refresh logic 206. Because refresh logic 206 includes an address counter, only a system clock is required to drive refresh logic 206. For example, cache DRAM 200 can be implemented by using an Intel 21256 DRAM that provides an on-chip refresh control and address counter that only requires a two phase clock ($\overline{RAS}$ and $\overline{CAS}$) be supplied by cache controller 160 (FIG. 3) for operating the chip.

Figure 4:
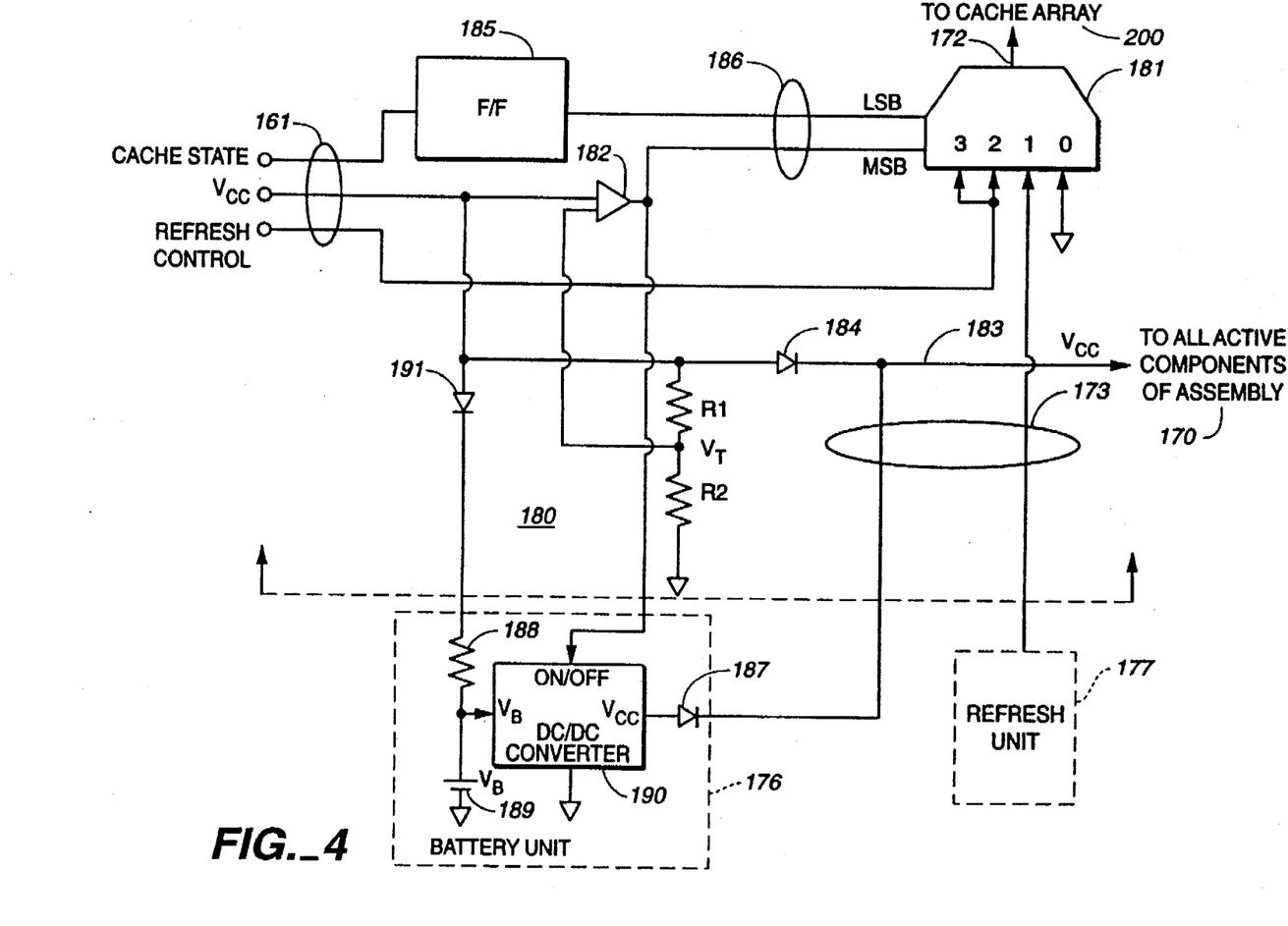
FIG. 4 shows a controller for detecting power failure and for operating the cache memory backup system.

FIG. 4 is a detailed circuit block diagram of the controller and selector 180 of FIG. 3. Referring to both FIGS. 3 and 4, the normal input from cache controller 160 is provided on input lines 161 that supply $V_{cc}$ for distribution to all active components in modular backup system 170, refresh control signals for driving the refresh control logic and address counter of cache array 200, and a cache state line for indicating if the cache data is "dirty" i.e. not exclusively owned and modified.

The $V_{cc}$ supplied through lines 161 is applied to diode 184 which is connected as shown so that current flows into diode 184 from the cache controller. The output from the diode is connected to line 183 for distribution of power throughout the modular backup assembly. (Details of the distribution of power are well known in the art and are therefore omitted in order to more clearly describe the invention.) Line 183 is also connected to the $V_{cc}$ output of battery unit 176 that contains a rechargeable battery for supplying backup power to modular backup assembly 170. If the $V_{cc}$ supplied from the cache controller by input 161 is greater than the battery $V_{cc}$ level, a trickle charge is supplied through diode 191 to the battery through resistor 188. Input 161 also supplies the necessary current required by the active circuits of the modular backup assembly. If the power supplied by the cache controller should drop below the $V_{cc}$ level supplied by battery unit 176, diode 184 is backward biased and isolates (disconnects) the cache controller $V_{cc}$ source from battery unit 176, and diode 187 in battery unit 176 is forward-biased for providing a low resistance path for the battery supplied current. Conversely, if the power level supplied by the cache controller returns to normal after having dropped, the cache controller-supplied $V_{cc}$ is restored. In this manner, a smooth transition between the primary cache controller-supplied power and the backup battery power is achieved.

The $V_{cc}$ line from input 161 is also applied to an input of voltage comparator 182 and the other (reference) input is connected to the threshold voltage ($V_T$) output of voltage divider R1, R2. The threshold voltage is pre-fixed at the lowest acceptable level for $V_{cc}$ so that if $V_{cc}$ falls below that level, the output from comparator 182 is at the logic low level. Otherwise, voltage comparator 182 output is at the logic high state.

The cache state line of input 161 carries a binary signal indicating if the cache is dirty, and is stored in flip-flop 185. The output state of flip-flop 185, together with the output of comparator 182, forms a 2-bit binary selector code on lines 186, applied to the select input of MUX 181. When the cache state is dirty, the output of flip-flop 185 is at the high logic level; otherwise, it is at the low logic level.

Figure 5:
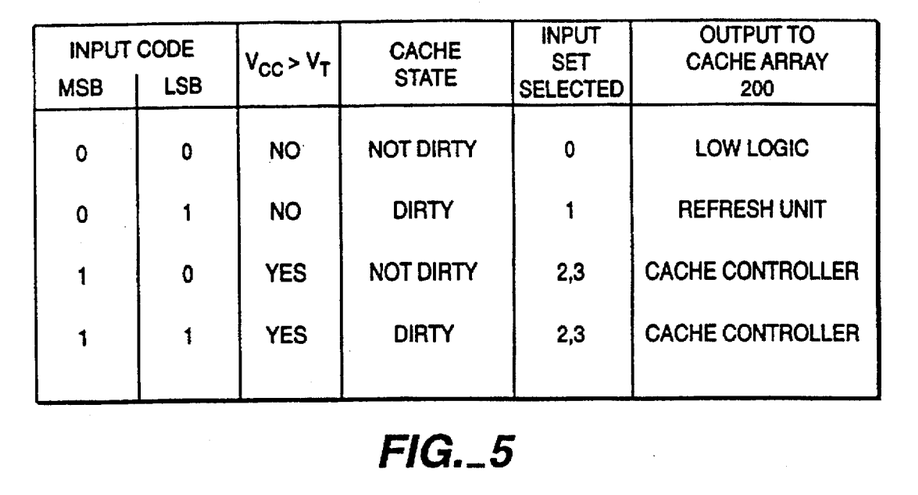
FIG. 5 is a logic table used in the operation of the preferred embodiment of the invention.

MUX 181 has four sets of inputs labeled 0–3 and one output set of lines 172 used to deliver the refresh control signals to cache array 200. The particular set of inputs selected is determined by the state of the 2-bit select code as shown in the first two columns of the logic table of FIG. 5. Referring to FIGS. 4 and 5, the output from comparator 182 is labeled "msb" (most significant bit) while the output of flip/flop 185 is labeled "lsb" (least significant bit). The second and third columns give the physical meaning: the msb is low when the cache controller-supplied $V_{cc}$ is greater than the threshold voltage, $V_T$, input to comparator 182, and high otherwise. The lsb low state indicates that the cache is not dirty, while the high state means that the cache contents are dirty. The fifth and sixth columns indicate which set of input lines are selected for outputting. Thus, for input msb/lsb (0,0), no refresh control signal is supplied because the cache data is not modified and hence can be restored from main memory. For input (0,1), refresh unit 177 output refresh control signal set is selected. Whenever msb=1 (high), the cache controller supplies $V_{cc}$ and the refresh control signal set, and deactivates DC/DC converter 221 by means of control line 192 that is connected to the on/off control.

Referring back to FIG. 4, battery unit 176 includes a battery power source 189 which is a single cell nickel-cadmium (nicad) battery that produces an output voltage, $V_B$, of approximately 2.4 volts. Battery 189 provides the power required to drive DC to DC voltage converter 190 for producing a backup output voltage, $V_{cc}$. A typical value of $V_{cc}$ for operating the DRAM array is 5.0 ±0.5 volts. Thus, DC/DC converter 190 supplies the backup through diode 187 when the $V_{cc}$ level supplied by cache controller on input line 161 drops below the $V_{cc}$ voltage level supplied by DC/DC converter 190. Hence, the nominal $V_{cc}$ output level from DC/DC converter 190 should be set lower than the nominal $V_{cc}$ level supplied on input lines 161.

Figure 6:
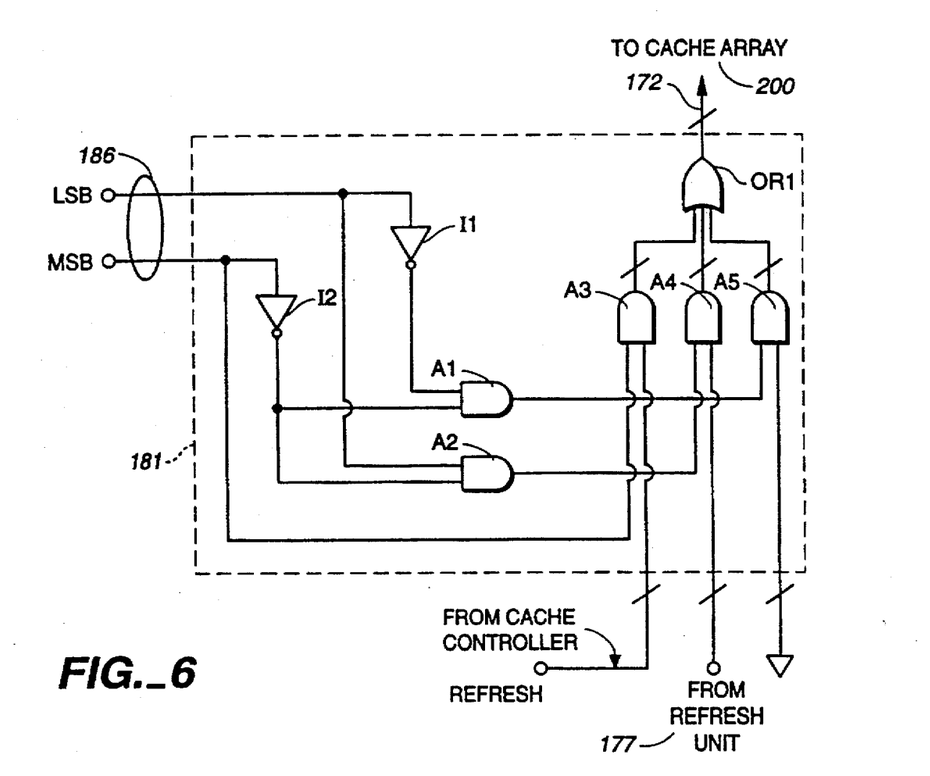
FIG. 6 is a logic diagram for the alternative selector (MUX) shown in FIG. 4.

FIG. 6 is a logic diagram showing an alternative implementation of MUX 181 that includes lsb and msb input lines 186, inverters I1 and I2, two input AND-gates A1 and A2, and a set of and gates A3, A4, and A5 for selecting one set of input lines: either cache controller refresh lines, refresh unit 177 refresh lines, or low logic level lines to prevent supplying a set of refresh control signals when the cache controller-supplied $V_{cc}$ is below threshold voltage, $V_T$, and the cache contents are not dirty. The latter choice is an option that allows the cache memory contents to be lost because the non-dirty state means that the cache contents have not been modified and hence are recoverable from main memory. If this option is not exercised, the selector (MUX) 181 implementation can be further simplified by eliminating the logic components associated with selecting the set of low logic level lines (I1, A1, and A5). OR-gate OR1 selects the active set of lines from either A3, A4, or A5 for outputting on output lines 172.

Figure 7:
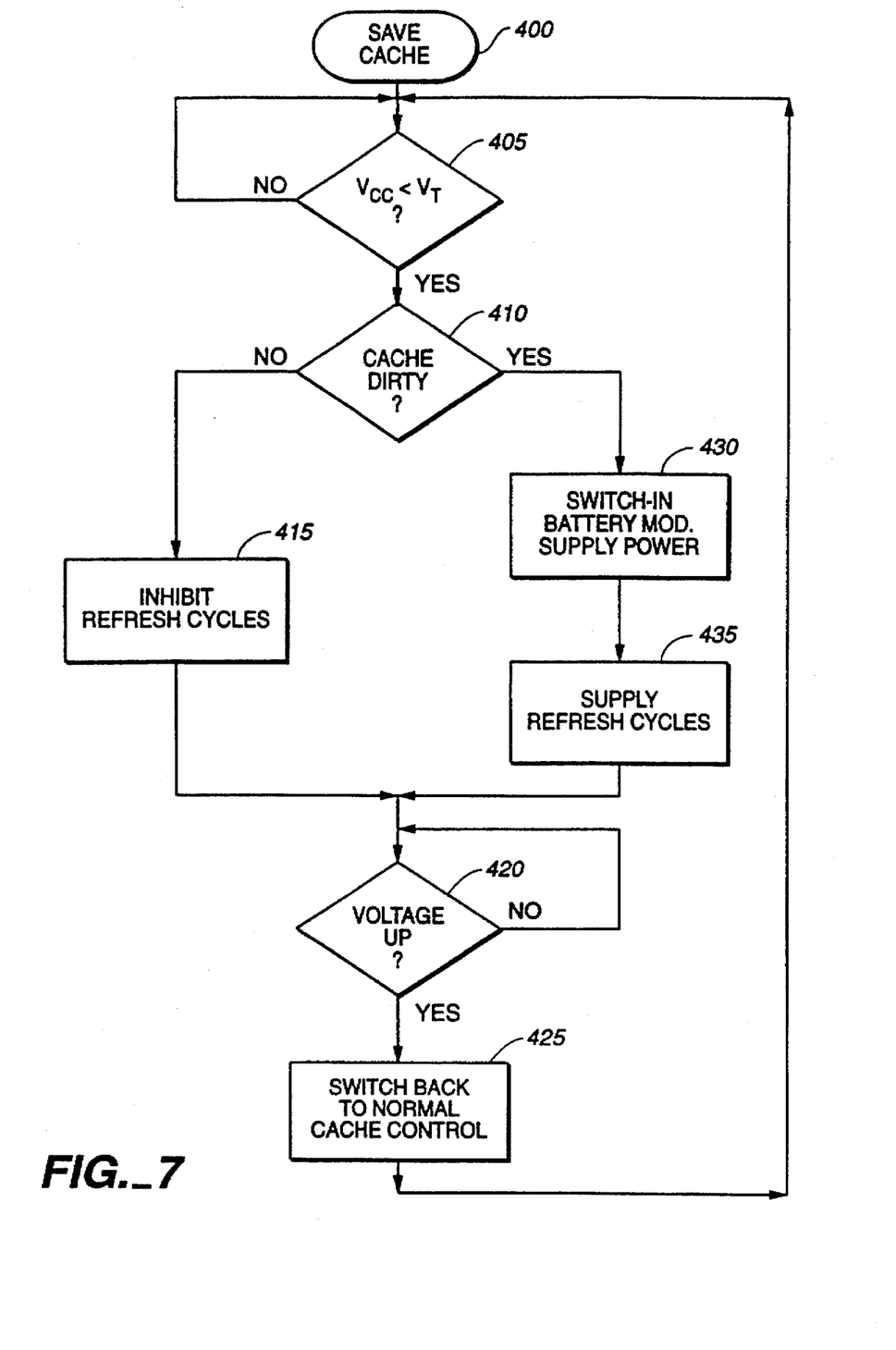
FIG. 7 is a flow diagram showing the method of operating the cache memory backup system.

FIG. 7 is a flow diagram that summarizes the method (SAVE CACHE 400) by which the cache memory backup apparatus of FIG. 4 functions. Step 405 checks if the cache controller supplied $V_{cc}$ is less than the threshold voltage, $V_T$, and if so proceeds to step 410. Otherwise, the cache continues to operate until $V_{cc}<V_T$. Step 410 checks if the cache is in a dirty state and, if so, the backup battery is switched in to supply the cache backup module with $V_{cc}$ and proceeds to step 435 where the required refresh control signals to preserve the cache contents are supplied to the cache array by the refresh signal generation unit. If the cache is not dirty, step 415 inhibits the refresh control signals, or by not supplying the cache DRAM with the required refresh control signals or by not supplying backup $V_{cc}$ power to the cache array. Step 420 monitors the cache controller-supplied $V_{cc}$ for the return of normal power in step 425 and when restored, power and refresh control signals are again provided by the cache controller. The method returns to step 405 to await another $V_{cc}$ failure.

It should be noted that an important optional feature of the backup system is the physically separable module 170 of FIG. 3. By being physically separable from the cache controller and the host computer system, battery backup module 170 can be removed from the failed physical environment and "plugged" into another system with an operating cache controller. This allows the contents of the cache to be accessed by the new host system for updating main memory and/or resuming execution of the program during which the cache controller failure occurred. An industry standard single in-line memory module (SIMM) type physical configuration is suitable.

As will be understood by those skilled in the art, many changes in the methods and apparatus described above may be made by the skilled practitioner without departing from the spirit and scope of the invention, which should be limited only as set forward in the claims which follow.

What is claimed is:

1. A battery backup system for a cache dynamic random access memory (DRAM) in a computer system wherein the cache DRAM is controlled by a cache controller that provides refresh signals for the cache DRAM, the battery backup system providing power and refresh signals to the DRAM cache memory if the system power supply should fail, comprising:

(a) a battery source for supplying backup power to the cache DRAM;

(b) a refresh generator with a refresh signal output, for generating refresh signals for refreshing the cache DRAM; and (c) a backup system controller and selector for sensing the computer system power supply voltage and selecting the system power supply for supplying power to the battery backup system when the system power supply is operating at a proper output voltage level and for selecting the battery power source otherwise, the backup system controller connecting the cache DRAM refresh signal input to the cache controller refresh signal output when the system power supply is operating at a proper output voltage level, and for connecting the cache DRAM memory refresh signal input to the refresh generator refresh signal output when the system power supply is not operating at the proper output voltage level.

2. The battery backup system of claim 1 further comprising a trickle charge circuit for charging the battery power source from the system power supply.

3. A modular battery backup cache system for a dynamic random access memory (DRAM) for use in a computer system, the DRAM cache memory controlled by a cache controller that provides refresh signals for the DRAM cache memory, the system powered by a computer system power supply, the battery backup system providing power and refresh signals to the DRAM cache memory if the system power supply fails, the modular battery backup system physically configured as a single module that can be physically disconnected from the computer system and associated cache controller, the modular battery backup cache system comprising:

(a) a DRAM cache memory comprising an array of dynamic memory cells and refresh circuitry with inputs for accepting a set of refresh control signals for refreshing the DRAM contents;

(b) a battery source for supplying backup power to the DRAM cache memory;

(c) a refresh generator having a refresh signal output, for generating a set of refresh signals at the refresh signal output for refreshing the DRAM cache memory; and (d) a backup system controller and selector for selecting the system power supply for supplying power to the modular backup system when the system power supply is operating at a proper output voltage level, and for selecting the battery power source otherwise, the backup system controller also for connecting the DRAM cache refresh signal set input to the cache controller refresh signal output when the system power supply is operating at a proper output voltage level, and for connecting the DRAM cache memory refresh signal set input to the refresh generator refresh signal output when the system power supply is not operating at the proper output voltage level.

4. The modular battery backup cache system of claim 3 further comprising a trickle charge circuit for charging the battery power source from the system power supply.

5. The modular battery backup cache system of claim 3 further comprising:

an input for accepting a cache status signal from the cache controller that indicates if the DRAM cache contents are dirty; and where the refresh generator is inhibited from applying a set of refresh signals to the DRAM cache memory when the cache status signal indicates that the DRAM cache memory contents are dirty.

6. The modular battery backup cache system of claim 3 wherein the physical module is a single in-line memory module (SIMM).

7. The modular battery backup cache system of claim 3 wherein the DRAM cache memory incorporates refresh logic and address counter for generating a set of refresh signals and operating under control of refresh control signals supplied by the backup system controller.

8. A modular battery backup for a cache memory system, the cache memory system including a cache controller and a cache memory element powered by a common power system, the modular battery backup comprising:

a battery backup unit;

a backup controller and selector for sensing and selecting the battery backup unit to supply power to the cache memory element upon failure of the common power system; and a backup refresh generator for generating refresh signals to refresh the contents of the cache memory element upon the failure of the common power system.

9. The modular battery backup of claim 8 further including:

a detector for sensing when the cache memory element is dirty, and the backup controller and selector inhibiting the refresh of the cache memory element by the backup refresh generator if the cache memory element is not dirty.

* * * * *